US012581793B2

(12) United States Patent
Zhang et al.

(10) Patent No.: US 12,581,793 B2
(45) Date of Patent: Mar. 17, 2026

(54) ORGANIC LIGHT-EMITTING DEVICE AND PREPARATION METHOD THEREFOR, DISPLAY PANEL, AND DISPLAY DEVICE

(71) Applicant: BOE TECHNOLOGY GROUP CO., LTD., Beijing (CN)

(72) Inventors: Xiaojin Zhang, Beijing (CN); Xinghua Liu, Beijing (CN); Huiyun Yang, Beijing (CN); Dan Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 1023 days.

(21) Appl. No.: 17/765,005

(22) PCT Filed: May 13, 2021

(86) PCT No.: PCT/CN2021/093668
§ 371 (c)(1),
(2) Date: Mar. 30, 2022

(87) PCT Pub. No.: WO2021/254051
PCT Pub. Date: Dec. 23, 2021

(65) Prior Publication Data
US 2022/0416190 A1      Dec. 29, 2022

(30) Foreign Application Priority Data
Jun. 18, 2020     (CN) .......................... 202010557639.5

(51) Int. Cl.
*H01L 51/50*          (2006.01)
*H10K 50/11*          (2023.01)
(Continued)

(52) U.S. Cl.
CPC .......... *H10K 50/121* (2023.02); *H10K 50/11* (2023.02); *H10K 85/50* (2023.02); *H10K 50/18* (2023.02);
(Continued)

(58) Field of Classification Search
None
See application file for complete search history.

(56) References Cited

U.S. PATENT DOCUMENTS

2016/0248032 A1     8/2016   Satoshi et al.
2020/0185621 A1     6/2020   Mi-Sang et al.

FOREIGN PATENT DOCUMENTS

CN          105895811 A      8/2016
CN          106716668 A      5/2017
(Continued)

OTHER PUBLICATIONS

Office action from Chinese Application No. 2020105576939.5 dated Nov. 3, 2022.
(Continued)

*Primary Examiner* — Gregory D Clark
(74) *Attorney, Agent, or Firm* — Calfee, Halter & Griswold LLP

(57)          ABSTRACT

An organic light-emitting device and a preparation method therefor, a display panel, and a display device. The organic light-emitting device comprises an anode layer, a cathode layer, and a first light-emitting layer and an auxiliary light-emitting layer disposed between the anode layer and the cathode layer; the auxiliary light-emitting layer is located between the first light-emitting layer and the cathode layer; the first light-emitting layer comprises a first host material, a first thermally activated delayed fluorescence material, and a first fluorescence guest material; the auxiliary light-emitting layer comprises at least a second host material and a second thermally activated delayed fluorescence material. The first light-emitting layer is a super-fluorescence system, and the auxiliary light-emitting layer also forms a super-fluorescence system together with the first fluorescence guest material.

18 Claims, 3 Drawing Sheets

(51) Int. Cl.

| | | |
|---|---|---|
| *H10K 50/12* | (2023.01) | |
| *H10K 85/50* | (2023.01) | |
| *H10K 50/18* | (2023.01) | |
| *H10K 59/10* | (2023.01) | |
| *H10K 101/00* | (2023.01) | |
| *H10K 101/30* | (2023.01) | |
| *H10K 101/40* | (2023.01) | |
| *H10K 102/00* | (2023.01) | |

(52) U.S. Cl.

CPC ......... *H10K 59/10* (2023.02); *H10K 2101/30* (2023.02); *H10K 2101/40* (2023.02); *H10K 2101/90* (2023.02); *H10K 2102/351* (2023.02)

(56)                References Cited

FOREIGN PATENT DOCUMENTS

| | | | |
|---|---|---|---|
| CN | 106784354 | A | 5/2017 |
| CN | 108948098 | A * | 12/2018 |
| CN | 109088008 | A | 12/2018 |
| CN | 106784354 | B | 2/2019 |
| CN | 109378392 | A | 2/2019 |
| CN | 109524558 | A | 3/2019 |
| CN | 111029472 | A | 4/2020 |
| CN | 111269170 | A | 6/2020 |
| CN | 111653679 | A | 9/2020 |
| CN | 109378392 | B | 12/2020 |
| JP | 2019068068 | A | 4/2019 |
| JP | 2019009307 | A1 | 6/2020 |
| KR | 20170038681 | A | 4/2017 |
| KR | 20180079108 | A | 7/2018 |
| WO | 2019009307 | A1 | 1/2019 |
| WO | 2021/116234 | A1 | 6/2021 |

OTHER PUBLICATIONS

Written Opinion from PCT/CN2021/093668 dated Aug. 13, 2021.
International Search Report from PCT/CN2021/093668 dated Aug. 13, 2021.

\* cited by examiner

| encapsulation layer | 12 |
| cathode | 11 |
| EIL | 10 |
| ETL | 9 |
| HBL | 8 |
| EML-2 | 7 |
| EML-1 | 6 |
| EBL | 5 |
| HTL | 4 |
| HIL | 3 |
| anode | 2 |
| substrate | 1 |

ORGANIC LIGHT-EMITTING DEVICE AND PREPARATION METHOD THEREFOR, DISPLAY PANEL, AND DISPLAY DEVICE

CROSS REFERENCE

The present disclosure is a U.S. National Stage of International Application No. PCT/CN 2021/093668, filed on May 13, 2021, which claims priority to Chinese Patent Application No. 202010557639.5, filed on Jun. 18, 2020, entitled "ORGANIC LIGHT-EMITTING DEVICE AND PREPARATION METHOD THEREFOR, DISPLAY PANEL, AND DISPLAY DEVICE", both the entire contents of which are incorporated herein by reference in its entirety.

TECHNICAL FIELD

The present disclosure relates to the field of display technology, in particular, to an organic light-emitting device and a preparation method therefor, and further relates to a display panel including the organic light-emitting device, and a display device.

BACKGROUND

Thermally Activated Delayed Fluorescence (TADF) technology, as an organic light-emitting diode technology with application potential, has achieved rapid development in recent years and is known as the third-generation OLED (Organic Light-Emitting Diode) technology. The super-fluorescence technology based on the TADF sensitizer is considered as the most valuable TADF implementation solution, and has huge application potential in the field of next-generation flat-panel display, so it has become a hot spot of research and development.

It should be noted that the information disclosed in the Background section is only for enhancement of understanding of the background of the present disclosure, and therefore may contain information that does not form information of the prior art that is already known to a person of ordinary skill in the art.

SUMMARY

The present disclosure provides an organic light-emitting device, a preparation method therefor, a display panel and a display device.

According to an aspect of the present disclosure, there is provided an organic light-emitting device, including:

an anode layer;

a cathode layer, arranged opposite to the anode layer;

a first light-emitting layer, arranged between the anode layer and the cathode layer, including a first host material, a first thermally activated delayed fluorescent material and a first fluorescent guest material; and an auxiliary light-emitting layer, arranged between the first light-emitting layer and the cathode layer; the auxiliary light-emitting layer at least including a second host material and a second thermally activated delayed fluorescent material.

In an example embodiment of the present disclosure, the number of the auxiliary light-emitting layer is one or plural.

In an example embodiment of the present disclosure, the first host material has a lowest singlet energy of S1(A) and a lowest triplet energy of T1(A); the first thermally activated delayed fluorescence material has a lowest singlet energy of S1(B) and a lowest triplet energy of T1(B); the first fluorescent guest material has a lowest singlet energy of S1(C) and a lowest triplet energy of T1(C); the first host material has a HOMO energy level of HOMO(A) and a LUMO energy level of LUMO(A); the first thermally activated delayed fluorescence material has a HOMO energy level of HOMO(B) and a LUMO energy level of LUMO(B); the first light-emitting layer satisfies following conditions:

$$S1(A)\text{-}T1(A)>0.2 \text{ eV}$$

$$S1(B)\text{-}T1(B)<0.2 \text{ eV}$$

$$S1(C)\text{-}T1(C)>0.2 \text{ eV}$$

$$S1(A)>S1(B)>S1(C)$$

$$T1(A)>T1(B)$$

$$|HOMO(A)\text{-}HOMO(B)|<0.2 \text{ eV}$$

$$|LUMO(B)|\text{-}|LUMO(A)|>0.3 \text{ eV}$$

$$|HOMO(A)|\text{-}|LUMO(B)|>S1(B)$$

and under normalized conditions, an overlapping area of an absorption spectrum of the first fluorescent guest material and an emission spectrum of the first thermally activated delayed fluorescent material is not less than 50% of an area of an emission spectrum of the second thermally activated delayed fluorescent material.

In an example embodiment of the present disclosure, the second host material has a lowest singlet energy of S1(D) and a lowest triplet energy of T1(D); the second thermally activated delayed fluorescence material has a lowest singlet energy of S1(E) and a lowest triplet energy of T1(E); the second host material has a HOMO energy level of HOMO (D) and a LUMO energy level of LUMO(D); the second thermally activated delayed fluorescence material has a HOMO energy level of HOMO(E) and a LUMO energy level of LUMO(E); the auxiliary light-emitting layer satisfies following conditions:

$$S1(D)\text{-}T1(D)>0.2 \text{ eV}$$

$$S1(E)\text{-}T1(E)<0.2 \text{ eV}$$

$$|HOMO(D)\text{-}HOMO(E)|<0.2 \text{ eV}$$

$$|LUMO(E)|\text{-}|LUMO(D)|>0.3 \text{ eV}$$

$$|HOMO(D)|\text{-}|LUMO(E)|>S1(E)$$

and under normalized conditions, an overlapping area of the absorption spectrum of the first fluorescent guest material and an emission spectrum of the second thermally activated delayed fluorescent material is not less than 50% of the area of the emission spectrum of the second thermally activated delayed fluorescent material.

In an example embodiment of the present disclosure, the first host material and the second host material are identical or different;

in a case that the first host material and the second host material are different, the first host material and the second host material satisfy following conditions:

$$|HOMO(A)\text{-}HOMO(D)|<0.2 \text{ eV}$$

$$|T1(A)\text{-}T1(D)|<0.1 \text{ eV}$$

$$|HOMO(D)\text{-}LUMO(B)|>S1(B).$$

The first thermally activated delayed fluorescent material and the second thermally activated delayed fluorescent material are identical or different;

in a case that the first thermally activated delayed fluorescent material and the second thermally activated delayed fluorescent material are different, the first host material and the second host material satisfy following conditions:

$$|T1(E)\text{-}T1(B)|<0.1 \text{ eV}$$

$$|S1(E)\text{-}S1(B)|<0.1 \text{ eV}$$

$$|LUMO(B)\text{-}LUMO(E)|<0.2 \text{ eV}$$

$$|HOMO(A)\text{-}LUMO(E)|>S1(E).$$

In an example embodiment of the present disclosure, the auxiliary light-emitting layer further includes a second fluorescent guest material.

In an example embodiment of the present disclosure, the first fluorescent guest material and the second fluorescent guest material are identical or different;

in a case that the first fluorescent guest material and the second fluorescent guest material are different, the first fluorescent guest material has the lowest singlet energy of S1(F), the lowest triplet energy of T1(F), a HOMO energy level of HOMO(F), and a LUMO energy level of LUMO(F); the auxiliary light-emitting layer further satisfies:

$$S1(F)\text{-}T1(F)>0.2 \text{ eV}$$

$$S1(D)>S1(E)>S1(F)$$

and under normalized conditions, an overlapping area of an absorption spectrum of the second fluorescent guest material and the emission spectrum of the second thermally activated delayed fluorescent material is not less than 50% of the area of the emission spectrum of the second thermally activated delayed fluorescent material.

In an example embodiment of the present disclosure, in a case that the first fluorescent guest material and the second fluorescent guest material are different, the auxiliary light-emitting layer further satisfies:

$$S1(F)>S1(C)$$

and a wavelength band covered by an emission spectrum of the second fluorescent guest material is smaller than a wavelength band covered by an emission spectrum of the first fluorescent guest material, and under normalized conditions, an overlapping area of the absorption spectrum of the first fluorescent guest material and the emission spectrum of the second fluorescent guest material is not less than 50% of an area of the emission spectrum of the second fluorescent guest material.

In an example embodiment of the present disclosure, the first host material and the second host material are respectively selected from carbazole-based materials; the first thermally activated delayed fluorescence material and the second thermally activated delayed fluorescence material are respectively selected from triazine, pyridine, ketone, and quinone; and the first fluorescent guest material and the second fluorescent guest material are respectively selected from pyrene, anthracene, fluorene, and pyrrole.

In an example embodiment of the present disclosure, the first thermally activated delayed fluorescent material accounts for X % of a total mass of the first thermally activated delayed fluorescent material and the first host material, the second thermally activated delayed fluorescent material accounts for Y % of a total mass of the second thermally activated delayed fluorescent material and the second host material, where Y %>X %.

In an example embodiment of the present disclosure, Y %-X %≥5%.

In an example embodiment of the present disclosure, a doping amount of the first fluorescent guest material in the first light-emitting layer and a doping amount of the second fluorescent guest material in the auxiliary light-emitting layer are both higher than 0.5%, and not higher than 5%.

In an example embodiment of the present disclosure, the first light-emitting layer has a thickness of 10-30 nm, and the auxiliary light-emitting layer has a thickness of not more than 1-10 nm.

In an example embodiment of the present disclosure, the organic light-emitting device further includes:

a hole blocking layer, arranged between the auxiliary light-emitting layer and the cathode layer, a lowest triplet energy of the hole blocking layer is not lower than a lowest triplet energy of the second thermally activated delayed fluorescent material, and a HOMO energy level of the hole blocking layer is at least 0.2 eV higher than a HOMO energy level of the second host material;

an electron blocking layer, arranged between the first light-emitting layer and the anode layer, a lowest triplet energy of the electron blocking layer is not lower than a lowest triplet energy of the first thermally activated delayed fluorescent material, and an absolute value of a difference value between a HOMO energy level of the electron blocking layer and a HOMO energy level of the first host material does not exceed 0.2 eV.

According to another aspect of the present disclosure, there is provided a method for preparing an organic light-emitting device, including:

forming an anode layer;

forming a first light-emitting layer on the anode layer, wherein the first light-emitting layer includes a first host material, a first thermally activated delayed fluorescent material and a first fluorescent guest material;

forming an auxiliary light-emitting layer on a side of the first light-emitting layer away from the anode layer, wherein the auxiliary light-emitting layer includes a second host material and a second thermally activated delayed fluorescent material, or the auxiliary light-emitting layer includes a second host material, a second thermally activated delayed fluorescent material and a second fluorescent guest material;

forming a cathode layer on a side of the auxiliary light-emitting layer away from the first light-emitting layer.

According to yet another aspect of the present disclosure, there is provided a display panel including the organic light-emitting devices described above.

According to yet another aspect of the present disclosure, there is provided a display device including the display panel described above.

It should be noted that the above general description and the following detailed description are merely exemplary and exemplary and should not be construed as limiting of the present disclosure.

BRIEF DESCRIPTION OF THE DRAWINGS

The accompanying drawings, which are incorporated in and constitute a part of this specification, illustrate embodiments consistent with the disclosure and serve to explain the principles of the disclosure together with the description. The drawings in the following description are only some embodiments of the present disclosure, and for those of ordinary skill in the art, other drawings can also be obtained from these drawings without creative effort.

DETAILED DESCRIPTION

Figures 1, 2:
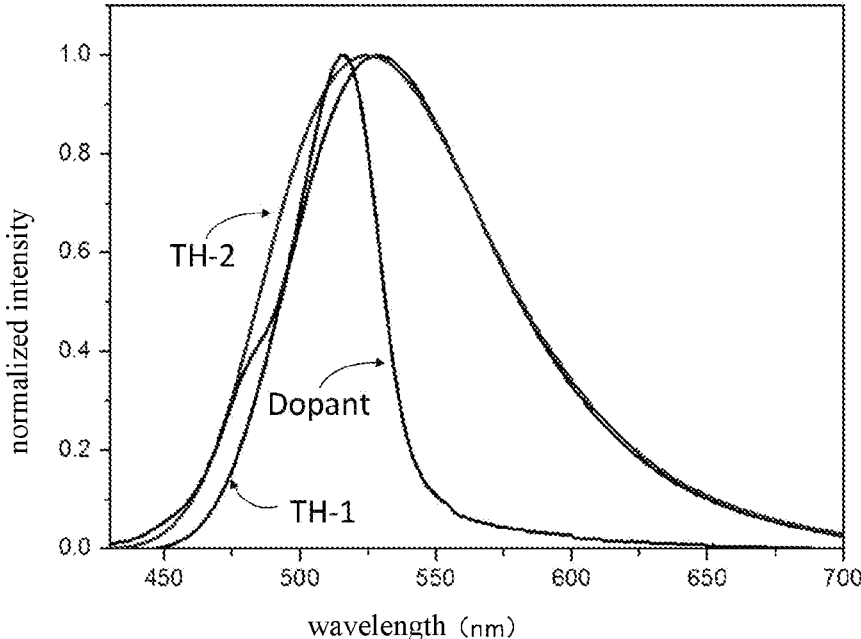
FIG. 1 is a schematic structural diagram of a light-emitting device in an embodiment of the present application.
FIG. 2 is the emission spectrum and absorption spectrum of each material of the experimental example.

Example embodiments will now be described more fully with reference to the accompanying drawings. Example embodiments, however, can be embodied in various forms and should not be construed as limited to the embodiments set forth herein; rather, these embodiments are provided so that this disclosure will be thorough and complete, and will fully convey the concept of example embodiments to those skilled in the art. The same reference numerals in the drawings denote the same or similar structures, and thus their detailed descriptions will be omitted.

In the related art, the light-emitting layer of the organic light-emitting device can adopt a super-fluorescence system. That is, the light-emitting layer includes a host material, a thermally activated delayed fluorescent material and a fluorescent guest material. The thermally activated delayed fluorescent material acts as a sensitizer. Since the thermally activated delayed fluorescent material can transfer energy from the triplet state to the singlet state through inverse intersystem jumping, and then transfer from the singlet state to the singlet energy level of the guest material through Forster energy transfer, the energy is effectively utilized by the fluorescent guest material. The system breaks through the traditional limit of 25% and achieves a theoretical 100% internal quantum efficiency, making the energy transfer from the host material to the guest material more sufficient. For the super-fluorescence system, the energy transfer manner of the host material, thermally activated delayed fluorescent material, and fluorescent guest material is mainly Forster energy transfer. The Forster energy transfer refers to the non-radiative energy transfer caused by molecular dipole-dipole interaction.

However, as for the light-emitting layer of this system, the host material usually adopts a hole-transporting material, and the hole transport rate is greater than the electron transport rate, and the excitons formed in the first light-emitting layer are mainly concentrated on the side close to the cathode. However, the content of the sensitizer is limited. When the concentration of triplet excitons is high, the sensitizer captures too many excitons, which will cause severe triplet-triplet annihilation (TTA) effect, cause the efficiency to roll off and cause the lifespan of the light-emitting device to decrease.

Based on this, an organic light-emitting device is provided in an embodiment of the present disclosure to solve the problems existing in the existing super-fluorescence system. As shown in FIG. 1, the organic light-emitting device includes an anode layer 2 and a cathode layer 11 disposed opposite to each other. A first light-emitting layer 6 and an auxiliary light-emitting layer 7 are arranged between the anode layer 2 and the cathode layer 11. The auxiliary light-emitting layer 7 is located between the light-emitting layer 6 and the cathode layer 11. That is, the auxiliary light-emitting layer 7 is located on a side of the first light-emitting layer 6 away from the anode layer 2. The first light-emitting layer 6 includes a first host material, a first thermally activated delayed fluorescent material and a first fluorescent guest material. The auxiliary light-emitting layer 7 at least includes a second host material and a second thermally activated delayed fluorescent material.

In the present disclosure, an auxiliary light-emitting layer 7 is added to the side where the exciton concentration of the first light-emitting layer 6 of the conventional super-fluorescence system is higher, and the second host material and the second thermally activated delayed fluorescent material in the auxiliary light-emitting layer 7 and the first fluorescent guest material in the light-emitting layer 6 also constitute a super-fluorescent system, wherein the second thermally activated delayed fluorescent material also acts as a sensitizer. As a result, the overall content of the sensitizer in the effective light-emitting region near the cathode side is increased, and excess excitons are captured by the increased sensitizer, so that the utilization efficiency of triplet excitons by the light-emitting layer is higher, and the occurrence of TTA phenomenon is avoided, thereby improving the light-emitting efficiency and prolonging the lifespan of the device.

For convenience of description, the first thermally activated delayed fluorescent material is referred to as the first TADF material for short, and the second thermally activated delayed fluorescent material is referred to as the second TADF material for short.

The organic light-emitting device according to the embodiment of the present disclosure will be described in detail below.

Referring to FIG. 1, it is a schematic structural diagram of an organic light-emitting device in an exemplary embodiment. The organic light-emitting device is disposed on the substrate 1, and sequentially includes an anode layer 2, a hole injection layer 3, a hole transport layer 4, an electron blocking layer 5, a first light-emitting layer 6, an auxiliary light-emitting layer 7, and a hole blocking layer 8, an electron transport layer 9, an electron injection layer 10, a cathode layer 11, and an encapsulation layer 12 from bottom to top. It can be understood by those skilled in the art that the structure of the organic light-emitting device may be simpler, such as without a blocking layer, or may be more complicated, such as adding an optical cover layer. This structure is merely an example.

It should be noted that, in the organic light-emitting device of the present application, only one auxiliary light-emitting layer may be provided, or a plurality of stacked auxiliary light-emitting layers may be provided. When a plurality of auxiliary light-emitting layers are provided, the second host material and the second thermally activated delayed fluorescent material in each auxiliary light-emitting layer can form a super-fluorescence system with the first fluorescent guest material in the first light-emitting layer, to play the role of improving the light emitting efficiency of the first light-emitting layer. FIG. 1 only exemplarily shows the structure of a light-emitting device including one auxiliary light-emitting layer 7, and one auxiliary light-emitting layer is taken as an example for description.

In the first light-emitting layer and the auxiliary light-emitting layer of this embodiment, the lowest singlet energy of the first host material is defined as S1(A), and the lowest triplet energy of the first host material is defined as T1(A). The lowest singlet energy of the first TADF material is defined as S1(B), the lowest triplet energy of the first TADF material is defined as T1(B). The lowest singlet energy of the first fluorescent guest material is defined as S1(C), and the lowest triplet energy of the first fluorescent guest material is defined as T1(C). The lowest singlet energy of the second host material is S1(D), and the lowest triplet energy of the second host material is T1(D). The lowest singlet energy of the second TADF material is S1(E), and the lowest triplet energy of the second TADF material is T1(E). The highest occupied molecular orbital energy level (HOMO energy level) of the first host material is HOMO (A), and the lowest unoccupied molecular orbital energy level (LUMO energy level) of the first host material is LUMO (A). The HOMO energy level of the first TADF material is HOMO (B), and the LUMO energy level of the first TADF material is LUMO (B). The HOMO energy level of the first fluorescent guest material is HOMO (C), and the LUMO energy level of the first fluorescent guest material is LUMO (C). The HOMO energy level of the second host material is HOMO (D), and the LUMO energy level of the second host material is LUMO (D). The HOMO energy level of the second TADF material is HOMO (E), and the LUMO energy level of the second TADF material is LUMO (E).

In order to enable the first host material, the first TADF material, and the first fluorescent guest material in the first light-emitting layer 6 to form an ideal super-fluorescence system, firstly, the energy of each material should satisfy: S1(A)-T1(A)>0.2 eV, S1 (B)-T1(B)<0.2 eV, S1(C)-T1(C)>0.2 Ev. The lowest singlet energy S1 of the three materials needs to satisfy: S1(A)>S1(B)>S1(C), The lowest triplet energy T1 of the three materials need to satisfy: T1(A)>T1(B). At the same time, the energy level of each material should satisfy:

$$|HOMO(A)-HOMO(B)|<0.2 \text{ eV}$$

$$|LUMO(B)|-|LUMO(A)|>0.3 \text{ eV}$$

$$|HOMO(A)|-|LUMO(B)|>S1(B)$$

In this way, the holes in the first host material can be more smoothly transferred to the first TADF material without becoming hole traps, and the first TADF material can be used as an electron trap of the first host material, which helps excitons mainly form on the sensitizer. Meanwhile, no exciplex is generated between the first host material and the first TADF material. Meanwhile, the absorption spectrum of the first fluorescent guest material and the emission spectrum of the first TADF material need to have a large overlap, so that the Forster energy transfer between the first TADF material and the first fluorescent guest material is more sufficient.

In the auxiliary light-emitting layer 7, in order to make the second host material, the second TADF material, and the first fluorescent guest material form an ideal super-fluorescence system, so that the second TADF material can successfully transfer energy to the first fluorescent guest material to make it emit light after capturing excitons, the energy of the second host material and the second TADF material needs to satisfy: S1(D)-T1(D)>0.2 eV, S1(E)-T1(E)<0.2 eV. The energy levels of the two materials should satisfy:

$$|HOMO(D)-HOMO(E)|<0.2 \text{ eV}$$

$$|LUMO(E)|-|LUMO(D)|>0.3 \text{ eV}$$

$$|HOMO(D)|-|LUMO(E)|>S1(E)$$

The specific principle is the same as that of the first light-emitting layer, which is not repeated here. At the same time, the absorption spectrum of the first fluorescent guest material has a large overlap with the emission spectrum of the second TADF material, so that the Forster energy transfer between the second TADF material and the first fluorescent guest material is more sufficient.

If the materials of the above two light-emitting layers do not meet the above conditions, it may cause that the energy generated by the first TADF material and the second TADF material after capturing excitons cannot be transferred to the first fluorescent guest material, and instead cause the TADF material to emit light. This will lead to problems such as broadening the luminescence spectrum and decreasing the stability of the device.

It should be noted that, the larger the overlapping area of the absorption spectrum of the fluorescent guest material and the emission spectrum of the TADF material is, the more complete the quenching of the TADF material is, the more sufficient the Forster energy transfer is, and the more fully the fluorescent guest material can emit light. Preferably, under normalized conditions, the overlapping area of the absorption spectrum of the first fluorescent guest material and the emission spectrum of the first TADF material needs to be no less than 50% of the area of the emission spectrum of the first TADF material. Similarly, the overlapping area of the absorption spectrum of the first fluorescent guest material and the emission spectrum of the second TADF material needs to be no less than 50% of the area of the emission spectrum of the second TADF material.

In embodiments of the present disclosure, the second host material may be the same as the first host material, thereby allowing transport of excitons within the two layers of the same material without hindrance. The second host material can also be different from the first host material, so in order for the second TADF material in the auxiliary light-emitting layer 7 to successfully capture the excitons in the first light-emitting layer 6, the excitons need to be smoothly transported from the first light-emitting layer 6 to the auxiliary light-emitting layer 7, and the energy and energy levels of the two host materials need to meet following conditions:

$$|HOMO(A)-HOMO(D)|<0.2 \text{ eV}$$

$$|T1(A)-T1(D)|<0.1 \text{ eV}$$

$$|HOMO(D)-LUMO(B)|>S1(B)$$

When the above conditions are met, the first host material and the second host material will not form an obvious heterojunction in the two light-emitting layers, and triplet excitons and singlet excitons can be shared in the two layers. No exciplex is formed between the second host material and the first TADF material. At the same time, holes can also be shared between the two layers without forming a hole potential barrier, and then can combine with electrons to form excitons in both two light-emitting layers, thereby improving the light-emitting efficiency.

Likewise, in the embodiment of the present disclosure, the second TADF material may be the same as the first TADF material, thereby making the sensitization properties of the two light-emitting layers the same. The second TADF material can also be different from the first TADF material. To enable the second TADF material to sufficiently capture excitons to transfer energy to the first fluorescent guest material in the first light-emitting layer 6, the energy and energy levels of the two TADF materials need to meet following conditions:

$|T1(E)-T1(B)|<0.1Ev$ $|S1(E)-S1(B)|<0.1$ eV $|LUMO(B)-LUMO(E)|<0.2$ eV $|HOMO(A)-LUMO(E)|>S1(E)$

When the above conditions are satisfied, the first TADF material and the second TADF material will not form a heterojunction in the two light-emitting layers, and triplet excitons and singlet excitons can be shared in the two layers. No exciplex is formed between the first host material and the second TADF material. Electrons can be shared between the two layers without forming an electronic potential barrier, and then can combine with holes to form excitons in both two light-emitting layers, improving the light-emitting efficiency.

In another exemplary embodiment, the auxiliary light-emitting layer 7 further includes a second fluorescent guest material, so that the three materials of the second host material, the second TADF material and the second fluorescent guest material of the auxiliary light-emitting layer 7 may also form a super-fluorescence system.

Specifically, the lowest singlet energy of the first fluorescent guest material is defined as S1(F), the lowest triplet energy of the first fluorescent guest material is defined as T1(F), the HOMO energy level of the first fluorescent guest material is defined as HOMO(F), and the LUMO energy level of the first fluorescent guest material is defined as LUMO(F), then the first fluorescent guest material needs to satisfy:

$S1(F)-T1(F)>0.2$ eV $S1(D)>S1(E)>S1(F)$

In addition, the absorption spectrum of the second fluorescent guest material and the emission spectrum of the second TADF material have a large overlapping area. Combined with the energy conditions that the second host material and the second TADF material need to meet, the system composed of the above three has an ideal super-fluorescence effect. That is, the second fluorescent guest material can also emit light.

In the same way as above, under normalized conditions, the overlapping area of the absorption spectrum of the second fluorescent guest material and the emission spectrum of the second TADF material should not be less than 50% of the area of the emission spectrum of the second TADF material, so that the quenching of the second TADF material is more complete and the Forster energy transfer is more sufficient, and the second fluorescent guest material can emit light more fully It should be noted that although the auxiliary light-emitting layer 7 can emit light independently, the second host material and the second TADF material can still be combined with the first fluorescent guest material to form a super-fluorescent system because they satisfy the above defined conditions. As a result, the two light-emitting layers form three super-fluorescence systems, which greatly improves the exciton utilization efficiency, reduces the occurrence of TTA phenomenon, and prolongs the lifespan of the material.

In the present disclosure, the first fluorescent guest material and the second fluorescent guest material may be the same, so that the characteristics of light emitted by the two light-emitting layers are the same. The first fluorescent guest material and the second fluorescent guest material may also be different, and in this case, the two materials preferably satisfy the following conditions:

$S1(F)>S1(C)$ and the wavelength band covered by the emission spectrum of the second fluorescent guest material is smaller than the wavelength band covered by the emission spectrum of the first fluorescent guest material. That is to say, the second fluorescent guest material is short-wave emission relative to the first fluorescent guest material, and at this time, the energy can be transferred from the second fluorescent guest material to the first fluorescent guest material. At the same time, the absorption spectrum of the first fluorescent guest material and the emission spectrum of the second fluorescent guest material have a large overlapping area, and when the above conditions are met, the second fluorescent guest material will be quenched, so that energy is transferred to the first fluorescent guest material through Forster energy transfer to make it emit light. At this time, the second fluorescent guest material is equivalent to a sensitizer of the first guest material.

It can be understood that, the higher the overlapping area of the absorption spectrum of the first fluorescent guest material and the emission spectrum of the second fluorescent guest material is, the more complete the quenching of the second fluorescent guest material is, and the more sufficient the energy transfer is. Preferably, under normalized conditions, the overlapping area of the absorption spectrum of the first fluorescent guest material and the emission spectrum of the second fluorescent guest material is not less than 50% of the area of the emission spectrum of the second fluorescent guest material.

It should be noted that the first fluorescent guest material and the second fluorescent guest material of the present disclosure can be of any color, such as red, green, blue, etc. When the second fluorescent guest material only acts as a sensitizer, the light-emitting color of the light-emitting device is the light-emitting color of the first fluorescent guest material. When the second fluorescent guest material can also emit light, the light-emitting color of the light-emitting device is the color obtained by mixing the first fluorescent guest material and the second fluorescent guest material.

Preferably, on the premise that the above conditions are met, the materials that can be selected for the first host material and the second host material of the present disclosure include, but not limited to, carbazole-based materials with high T1 properties and their derivatives. Materials that can be selected for the first TADF material and the second TADF material include, but not limited to, triazine, pyridine, ketone, quinone and other materials with small ΔEst and their derivatives. Materials that can be selected for the first fluorescent guest material and the second fluorescent guest material include, but not limited to, pyrene, anthracene, fluorene or pyrrole with high light-emitting efficiency and their derivatives.

In the present disclosure, the content of each material and the thicknesses of the two light-emitting layers will affect the light-emitting efficiency and lifespan of the light-emitting layers. It is assumed that the first TADF material accounts for X % of the total mass of the first TADF material and the first host material, and the second TADF material accounts for Y % of the total mass of the second TADF material and the second host material. In some exemplary embodiments, both X % and Y % are in the range of 5%-50%. When the content of the TADF material is less than this range, the ideal sensitization effect cannot be achieved. When the content is too large, it is difficult for the fluorescent guest material to fully utilize the energy generated, resulting in concentration quenching. In some exemplary embodiments, Y %>X %. That is, the proportion of the second TADF material in the auxiliary light-emitting layer is greater than the proportion of the first TADF material in the first light-emitting layer, and the lifespan of the light-emitting material is longer in this case. The reason is that the overall content of the sensitizer in the effective light-emitting region near the cathode side increases, which increases the density of the light-emitting center per unit volume, which can effectively postpone the electrical degradation of a single light-emitting molecule. Preferably, Y %-X %≥5%. When this condition is met, the lifespan of the light-emitting material is improved more significantly.

On the other hand, when the auxiliary light-emitting layer 7 contains the second fluorescent guest material, the doping amount of the first fluorescent guest material in the first light-emitting layer and the doping amount of the second fluorescent guest material in the auxiliary light-emitting layer are both higher than 0.5% and not higher than 5%. Within this range, the second fluorescent guest material can play an ideal sensitizer role. If the doping amount is too low, the energy transferred by the TADF material cannot be fully absorbed. If the doping amount is too high, the guest material will capture carriers by itself, forming an inefficient trapped light-emitting center. As a further preference, the doping amounts of both the first fluorescent guest material and the second fluorescent guest material are not higher than 1.2%, which has a better effect on the utilization efficiency of excitons and the improvement of the lifespan of the device.

On the other hand, the thickness of the first light-emitting layer 6 and the thickness of the auxiliary light-emitting layer 7 also affect the distribution of excitons, sensitizers and fluorescent guests, thereby affecting the light-emitting efficiency and lifespan of the material. Preferably, the thickness of the first light-emitting layer 6 is 10-30 nm, and the thickness of the auxiliary light-emitting layer 7 is not more than 1-10 nm. As a further preference, the thickness of the auxiliary light-emitting layer 7 does not exceed 6 nm, and at this time, the comprehensive characteristic of the light-emitting efficiency and lifespan of the light-emitting material is optimal.

The materials of the two light-emitting layers of the light-emitting device shown in FIG. 1 have been described in detail above. In this exemplary embodiment, the light-emitting device further includes a hole blocking layer 8 disposed on the side of the auxiliary light-emitting layer 7 facing the cathode layer 11 and the electron blocking layer 5 disposed on the side of the first light-emitting layer 6 facing the anode layer 2. The lowest triplet energy of the hole blocking layer 8 is not lower than the lowest triplet energy T1 (E) of the second TADF material, and the HOMO energy level of the hole blocking layer 8 is at least 0.2 eV higher than the HOMO (D) of the second host material. The lowest triplet energy of the electron blocking layer 5 is not lower than the lowest triplet energy T1 (B) of the first TADF material, and the absolute value of the difference value between the HOMO energy level of the electron blocking layer 5 and the HOMO (A) of the first host material does not exceed 0.2 eV As a result, a hole potential barrier and an electron potential barrier can be respectively formed at two sides of the two light-emitting layers, so as to confine the energy in the light-emitting layers, so as to avoid a decrease in efficiency caused by energy loss.

As for other structural layers of the light-emitting device, the substrate 1 can be any transparent or opaque substrate material, such as glass, polyimide, and the like. The anode layer 2 can be made of high work function electrode materials, specifically transparent oxide ITO, IZO, etc., with a thickness of 80-200 nm; it can also be composite electrodes such as Ag/ITO, Al/ITO, Ag/IZO, Al/IZO, etc. The thickness of the metal in the composite electrode is generally 80-200 nm, and the thickness of the oxide layer is generally 5-20 nm. If a transparent oxide is used as the anode, the device corresponds to a bottom emission structure; if a composite electrode is used, the device corresponds to a top emission structure. The hole injection layer 3 can be made of materials such as CuPc, HATCN, MnO 3 or the like, or can be formed by p-type doping in a hole transport material. The thickness of this layer is 5 to 30 nm. The hole transport layer 4 can be formed of a material with good hole transport properties, and the thickness is in the range of 30-200 nm. The electron blocking layer 5 has a thickness of 5 to 90 nm, which satisfies the aforementioned conditions. The hole blocking layer 8 has a thickness of 5 to 30 nm, which satisfies the aforementioned conditions. The electron transport layer 9 may be formed by vapor deposition of materials with good electron transport properties, or may be formed by doping the electron transport materials with LiQ3, Li, Ca and other materials in a certain proportion, with a thickness of 10-70 nm. The electron injection layer 10 can be made of low work function metals such as Li, Ca, Yb, or metal salts LiF, LiQ3, etc., with a thickness of 0.5-2 nm. The cathode layer 11 can be formed of Al, Ag, Mg or an alloy of the above materials. If a bottom emission device is designed, the thickness of the layer should exceed 80 nm to ensure good reflectivity. If a top emission device is designed, the thickness of this layer needs to be adjusted in the range of 10-20 nm. When a top emission device is designed, an additional optical capping layer (CPL) can be deposited on top of the cathode, to ensure higher optical output. The CPL can be any organic material with a refractive index greater than 1.8 and a thickness between 50 and 100. In addition, if a top emission device is designed, the optical thickness of the organic layer between the cathode and the anode needs to meet the optical path requirements of the optical micro-resonator, so as to obtain the optimal light intensity and color. The encapsulation layer 12 may adopt UV sealant or film encapsulation or the like.

The performance of the light-emitting device of the present disclosure is tested and compared below. The bottom emission light-emitting device is taken as an example, the light-emitting device shown in FIG. 1 was prepared under the following conditions (the encapsulation layer was omitted in the following conditions).

Bottom Emission Device 1

ITO/HIL(10 nm)/HTL(160 nm)/EBL(10 nm)/TM:TH-1 dopant(25 nm, 80%:19.2%:0.8%)/HBL(5 nm)/ETL(40 nm)/EIL(1 nm)/Mg:Ag(100 nm)

Bottom Emission Device 2

ITO/HIL(10 nm)/HTL(160 nm)/EBL(10 nm)/TM:TH-1 dopant (22 nm, 80%:19%:1%)/TM:TH-1:dopant(3 nm, 70%: 29%: 1%)/HBL(5 nm)/ETL(40 nm)/EIL(1 nm)/Mg:Ag(100 nm)

Bottom Emission Device 3

ITO/HIL(10 nm)/HTL(160 nm)/EBL(10 nm)/TM:TH-1:dopant (20 nm, 80%:19%:1%)/TM:TH-1:dopant(8 nm, 70%: 29%: 1%)/HBL (5 nm)/ETL(40 nm)/EIL(1 nm)/Mg:Ag(100 nm)

Bottom Emission Device 4

ITO/HIL(10 nm)/HTL(160 nm)/EBL(10 nm)/TM TH-1:dopant(17 nm, 80%:19%:10%)/TM:TH-2(5 nm,60%:40%)/IBL(5 nm)/ETL(40 nm)/EIL(1 nm)/Mg:Ag(100 nm)

In the embodiment, the bottom emission device 1 includes only one light-emitting layer, and the bottom emission devices 2-4 all include a first light-emitting layer and an auxiliary light-emitting layer. TM is the host material in the first light-emitting layer and the second light-emitting layer. TH-1 and TH-2 are two different materials with TADF characteristics respectively, and dopant is a green fluorescent guest material. FIG. 2 shows the characteristics of emission spectrum of TH-1 and TH-2 and the absorption spectrum of the dopant. Table 1 shows the molecular energy orbital and excited state information of the above materials.

TABLE 1

| Molecular energy orbitals and excited states of materials | | | | |
|---|---|---|---|---|
| | HOMO | LUMO | T1 | S1 |
| TM | −5.92 eV | −2.76 eV | 2.86 eV | 3.42 eV |
| TH-1 | −5.8 eV | −3.4 eV | 2.37 eV | 2.45 eV |
| TH-2 | −5.75 eV | −3.1 eV | 2.35 eV | 2.47 eV |
| Dopant | −5.81 eV | −3.56 eV | not detected | 2.37 eV |

The performance of the above four devices is tested, and the results are shown in Table 2.

TABLE 2

| Summary of Device Features | | | | | |
|---|---|---|---|---|---|
| Device ID | Current Density (mA/cm2) | Voltage (V) | Efficiency Percentage | Color Coordinates (CIE-1931) | LT90 Lifespan Percentage |
| Device 1 | 15 | 4.9 | 100% | 0.29, 0.67 | 100% |
| Device 2 | 15 | 4.7 | 165% | 0.28, 0.67 | 169% |
| Device 3 | 15 | 4.5 | 159% | 0.27, 0.68 | 119% |
| Device 4 | 15 | 4.6 | 161% | 0.28, 0.68 | 150% |

Figure 3:
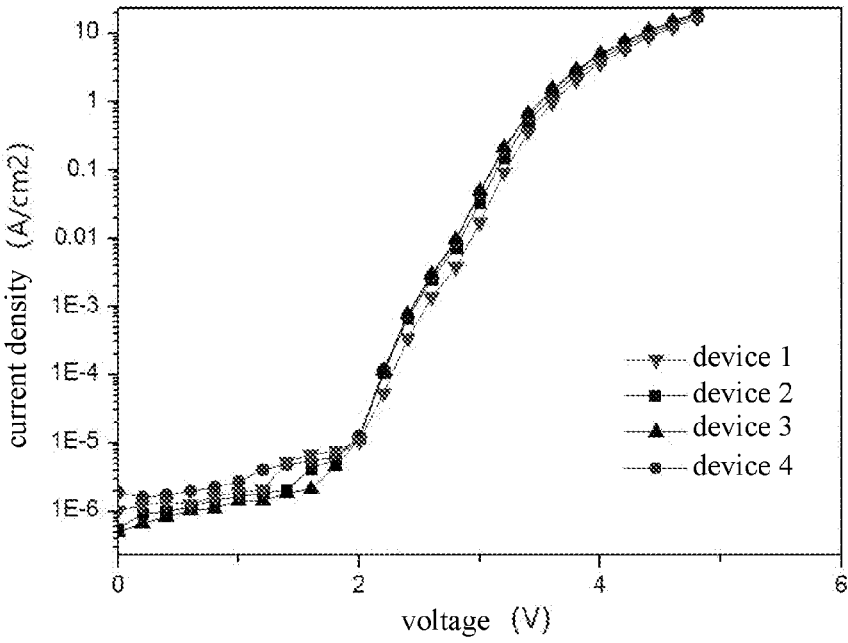
FIG. 3 is the voltage-current density characteristic curve of the experimental example.
Figure 4:
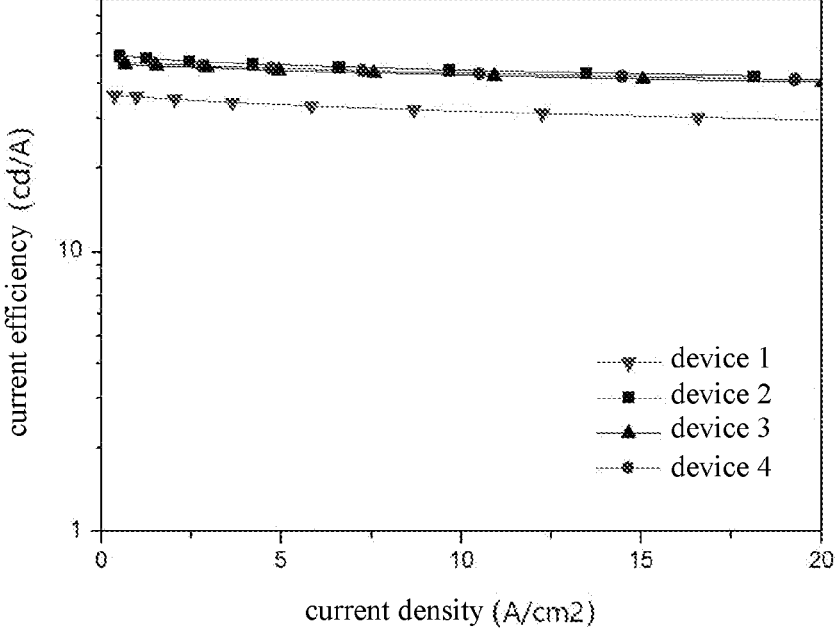
FIG. 4 is the current density-luminous flux characteristic curve of the experimental example.
Figure 5:
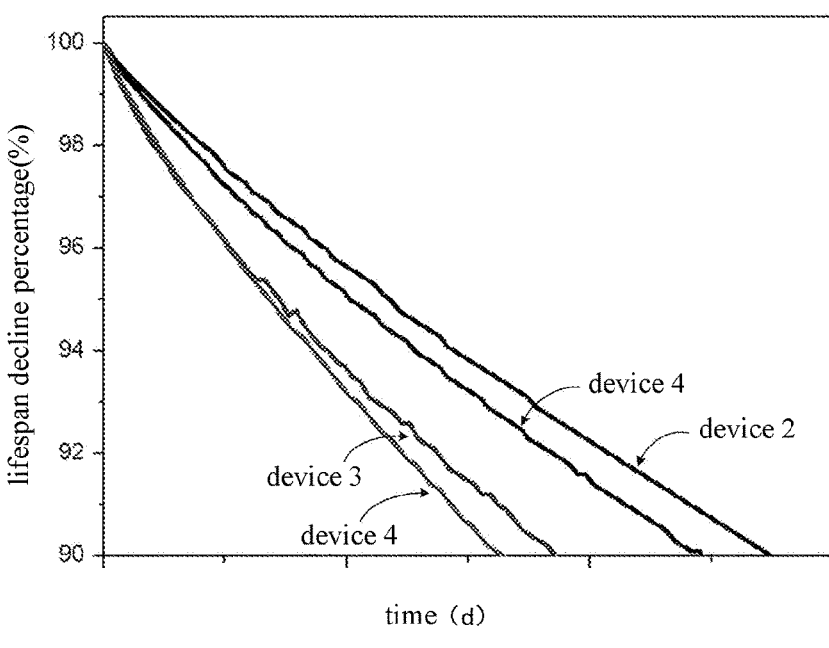
FIG. 5 is the change curve of the lifespan with time of the experimental example.

The voltage-current density characteristic curves of the above-mentioned four devices are shown in FIG. 3, and it can be seen from the figure that the arrangement of the auxiliary light-emitting layer of the present disclosure significantly improves the voltage-current density characteristic of the light-emitting device. The current density-luminous flux characteristic curves of the four devices are shown in FIG. 4, and it can be seen from the figure that the arrangement of the auxiliary light-emitting layer of the present disclosure significantly improves the current efficiency of the light-emitting device. The current efficiency of device 1 is taken as the benchmark, the ratios of the current efficiencies of the other three devices to the current efficiency of device 1 are shown in Table 2. It can also be seen that the arrangement of the auxiliary light-emitting layer significantly improves the light-emitting efficiency of the light-emitting device. The lifespan-time curves of the four devices are shown in FIG. 5. The lifespan LT90 of device 1 is taken as the benchmark, the ratios of the lifespans of the other three devices to lifespan of the device 1 are shown in Table 2. It can be seen that the arrangement of the auxiliary light-emitting layer significantly improves the lifespan of the light-emitting device. Among them, the overall performance of efficiency and lifespan of device 2 is the best.

The green light-emitting device is used as an example for illustration above, and light-emitting devices of other colors have similar effects to the above experiments.

Figure 6:
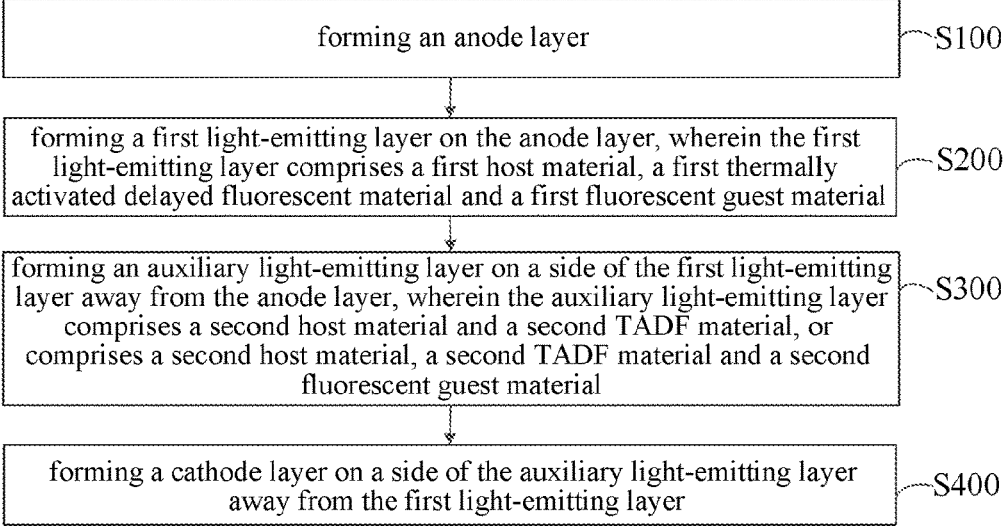
FIG. 6 is a flowchart of a method for preparing a light-emitting device in an embodiment of the present application.

The present disclosure further provides a method for preparing the light-emitting device in the above-mentioned embodiment. Referring to FIG. 6, the method includes:

step S100, forming an anode layer 2;

step S200, forming a first light-emitting layer 6 on the anode layer 2, wherein the first light-emitting layer 6 includes a first host material, a first thermally activated delayed fluorescent material and a first fluorescent guest material;

step S300, forming an auxiliary light-emitting layer 7 on a side of the first light-emitting layer 6 away from the anode layer 2, wherein the auxiliary light-emitting layer 7 includes a second host material and a second thermally activated delayed fluorescent material, or the auxiliary light-emitting layer includes a second host material, a second thermally activated delayed fluorescent material and a second fluorescent guest material; and step S400, forming a cathode layer 11 on a side of the auxiliary light-emitting layer 7 away from the first light-emitting layer 6.

The anode layer 2 can be formed by methods such as inkjet printing, and the cathode layer 11 can be formed by methods such as sputtering. Both the first light-emitting layer 6 and the auxiliary light-emitting layer 7 may adopt a multi-source co-evaporation method, and other methods such as inkjet printing may also be used. When there are a plurality of the auxiliary light-emitting layers 7, they may be formed on the first light-emitting layer layer by layer.

In addition, the above preparation method may further include the preparation of other film layers, such as the hole injection layer 3, the hole transport layer 4, the electron blocking layer 5, the hole blocking layer 8, the electron transport layer 9, the electron injection layer 10 or the like. The above-mentioned film layer can be formed by methods such as vapor deposition.

The present disclosure also provides a display panel, which includes the above-mentioned organic light-emitting devices. Since the organic light-emitting device has high light-emitting efficiency and long lifespan, the display panel has low energy consumption and long lifespan.

Figure 7:
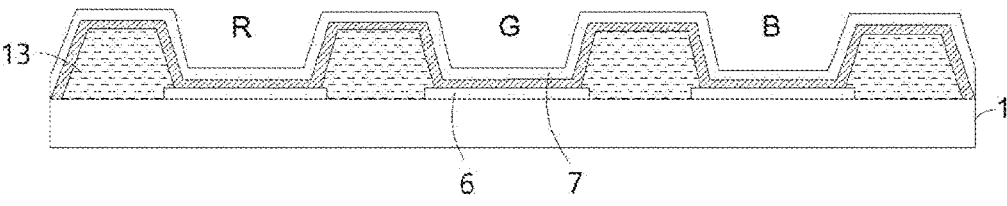
FIG. 7 is a schematic structural diagram of a display panel according to an embodiment of the present application.

The structure of the display panel is the same as that of the traditional OLED display panel. The light-emitting devices of different colors are arranged in the opening area defined by the pixel defining layer, and each is independently controlled by a control transistor to realize on and off, and then they are combined to present different colors, to achieve colorful display. For example, on the substrate of a display panel as shown in FIG. 7, the anode layer 2 of the light-emitting device of each sub-pixel is disposed at the bottom of the opening area defined by the pixel definition layer 13, connected to the corresponding control transistor (the transistor not shown in the figure) fabricated on the substrate 1, and the cathode layer 11 is covered on the top, and the cathode layer 11 of each sub-pixel can be fabricated on the entire surface. Similarly, the hole transport layer, electron transport layer, and encapsulation layer and other common film layers of each sub-pixel can also be made on the entire surface.

The display panel may be a transparent or opaque display panel, and may also be a rigid or flexible display panel.

The present disclosure also provides a display device including the above-mentioned display panel. It also has the same technical effect.

The present disclosure does not specifically limit the application of the display device, which can be any product or part with the display function, such as computers, mobile phones, navigators, billboards, e-books, digital photo frames, etc. These display devices can all use the above-mentioned display panels.

Although relative terms such as "on" and "under" are used in this specification to describe the relative relationship of one component of an icon to another component, these terms are used in this specification only for convenience, such as according to the directions of the examples in the accompanying drawings. It will be appreciated that if the device of the icon is turned upside down, the components described as "on" will become the components described as "under". When a certain structure is "on" other structures, it may mean that a certain structure is integrally formed on other structures, or that a certain structure is "directly" arranged on other structures, or that a certain structure is "indirectly" arranged on another structure through another structure.

The terms "a", "an", "the", "said" and "at least one" are used to indicate the presence of one or more elements/components/etc.; the terms "including" and "having" are used to indicate an open-ended inclusive meaning and means that additional elements/components/etc. may be present in addition to the listed elements/components/etc.

Other embodiments of the present disclosure will readily occur to those skilled in the art upon consideration of the specification and practice of the disclosure disclosed herein. This disclosure is intended to cover any variations, uses, or adaptations of this disclosure that follow the general principles of this disclosure and include common general knowledge or conventional technical means in the technical field not disclosed by this disclosure. The specification and embodiments are to be regarded as exemplary only, with the true scope and spirit of the disclosure being indicated by the appended claims.

What is claimed is:

1. An organic light-emitting device, comprising:

an anode layer;

a cathode layer, arranged opposite to the anode layer;

a first light-emitting layer, arranged between the anode layer and the cathode layer, comprising a first host material, a first thermally activated delayed fluorescent material and a first fluorescent guest material; and an auxiliary light-emitting layer, arranged between the first light-emitting layer and the cathode layer; the auxiliary light-emitting layer at least comprising a second host material and a second thermally activated delayed fluorescent material, wherein the number of the auxiliary light-emitting layer is one or plural, wherein the first host material has a lowest singlet energy of S1(A) and a lowest triplet energy of T1(A); the first thermally activated delayed fluorescence material has a lowest singlet energy of S1(B) and a lowest triplet energy of T1(B); the first fluorescent guest material has a lowest singlet energy of S1(C) and a lowest triplet energy of T1(C); the first host material has a HOMO energy level of HOMO(A) and a LUMO energy level of LUMO(A); the first thermally activated delayed fluorescence material has a HOMO energy level of HOMO(B) and a LUMO energy level of LUMO(B); the first light-emitting layer satisfies following conditions:

$$S1(A)\text{-}T1(A) > 0.2 \text{ eV}$$

$$S1(B)\text{-}T1(B) < 0.2 \text{ eV}$$

$$S1(C)\text{-}T1(C) > 0.2 \text{ eV}$$

$$S1(A) > S1(B) > S1(C)$$

$$T1(A) > T1(B)$$

$$|HOMO(A)\text{-}HOMO(B)| < 0.2 \text{ eV}$$

$$|LUMO(B)|\text{-}|LUMO(A)| > 0.3 \text{ eV}$$

$$|HOMO(A)|\text{-}|LUMO(B)| > S1(B)$$

and under normalized conditions, an overlapping area of an absorption spectrum of the first fluorescent guest material and an emission spectrum of the first thermally activated delayed fluorescent material is not less than 50% of an area of an emission spectrum of the second thermally activated delayed fluorescent material.

2. The organic light-emitting device according to claim 1, wherein the first thermally activated delayed fluorescent material accounts for X % of a total mass of the first thermally activated delayed fluorescent material and the first host material, the second thermally activated delayed fluorescent material accounts for Y % of a total mass of the second thermally activated delayed fluorescent material and the second host material, where Y %>X %.

3. The organic light-emitting device according to claim 2, wherein Y %-X %≥5%.

4. The organic light-emitting device according to claim 1, wherein the first light-emitting layer has a thickness of 10-30 nm, and the auxiliary light-emitting layer has a thickness of not more than 1-10 nm.

5. The organic light-emitting device according to claim 1, further comprising:

a hole blocking layer, arranged between the auxiliary light-emitting layer and the cathode layer, a lowest triplet energy of the hole blocking layer is not lower than a lowest triplet energy of the second thermally activated delayed fluorescent material, and a HOMO energy level of the hole blocking layer is at least 0.2 eV higher than a HOMO energy level of the second host material;

an electron blocking layer, arranged between the first light-emitting layer and the anode layer, a lowest triplet energy of the electron blocking layer is not lower than a lowest triplet energy of the first thermally activated delayed fluorescent material, and an absolute value of a difference value between a HOMO energy level of the electron blocking layer and a HOMO energy level of the first host material does not exceed 0.2 eV.

6. The organic light-emitting device according to claim 1, wherein the first thermally activated delayed fluorescent material accounts for X % of a total mass of the first thermally activated delayed fluorescent material and the first host material, the second thermally activated delayed fluorescent material accounts for Y % of a total mass of the second thermally activated delayed fluorescent material and the second host material, where Y %>X %.

7. The organic light-emitting device according to claim 1, wherein the first light-emitting layer has a thickness of 10-30 nm, and the auxiliary light- emitting layer has a thickness of not more than 1-10 nm.

8. The organic light-emitting device according to claim 1, wherein the second host material has a lowest singlet energy of S1(D) and a lowest triplet energy of T1(D); the second thermally activated delayed fluorescence material has a lowest singlet energy of S1(E) and a lowest triplet energy of T1(E); the second host material has a HOMO energy level of HOMO(D) and a LUMO energy level of LUMO(D); the second thermally activated delayed fluorescence material has a HOMO energy level of HOMO(E) and a LUMO energy level of LUMO(E); the auxiliary light-emitting layer satisfies following conditions:

17

$S1(D)-T1(D)>0.2$ eV $S1(E)-T1(E)<0.2$ eV $|HOMO(D)-HOMO(E)|<0.2$ eV $|LUMO(E)|-|LUMO(D)|>0.3$ eV $|HOMO(D)|-|LUMO(E)|>S1(E)$ and under normalized conditions, an overlapping area of the absorption spectrum of the first fluorescent guest material and an emission spectrum of the second thermally activated delayed fluorescent material is not less than 50% of the area of the emission spectrum of the second thermally activated delayed fluorescent material.

9. The organic light-emitting device according to claim 8, wherein the first host material and the second host material are identical or different;

in a case that the first host material and the second host material are different, the first host material and the second host material satisfy following conditions:

$|HOMO(A)-HOMO(D)|<0.2$ eV $|T1(A)-T1(D)|<0.1$ eV $|HOMO(D)-LUMO(B)|>S1(B)$;

the first thermally activated delayed fluorescent material and the second thermally activated delayed fluorescent material are identical or different;

in a case that the first thermally activated delayed fluorescent material and the second thermally activated delayed fluorescent material are different, the first host material and the second host material satisfy following conditions:

$|T1(E)-T1(B)|<0.1$ eV $|S1(E)-S1(B)|<0.1$ eV $|LUMO(B)-LUMO(E)|<0.2$ eV $|HOMO(A)-LUMO(E)|>S1(E)$.

10. The organic light-emitting device according to claim 9, wherein the auxiliary light-emitting layer further comprises a second fluorescent guest material.

11. The organic light-emitting device according to claim 10, wherein the first host material and the second host material are respectively selected from carbazole-based materials; the first thermally activated delayed fluorescence material and the second thermally activated delayed fluorescence material are respectively selected from triazine, pyridine, ketone, and quinone; and the first fluorescent guest material and the second fluorescent guest material are respectively selected from pyrene, anthracene, fluorene, and pyrrole.

12. The organic light-emitting device according to claim 10, wherein a doping amount of the first fluorescent guest material in the first light-emitting layer and a doping amount of the second fluorescent guest material in the auxiliary light-emitting layer are both higher than 0.5%, and not higher than 5%.

13. The organic light-emitting device according to claim 10, wherein the first fluorescent guest material and the second fluorescent guest material are identical or different;

in a case that the first fluorescent guest material and the second fluorescent guest material are different, the first fluorescent guest material has the lowest singlet energy of S1(F), the lowest triplet energy of T1(F), a HOMO energy level of HOMO(F), and a LUMO energy level of LUMO(F); the auxiliary light-emitting layer further satisfies:

$S1(F)-T1(F)>0.2$ eV $S1(D)>S1(E)>S1(F)$ and under normalized conditions, an overlapping area of an absorption spectrum of the second fluorescent guest material and the emission spectrum of the second thermally activated delayed fluorescent material is not less than 50% of the area of the emission spectrum of the second thermally activated delayed fluorescent material.

14. The organic light-emitting device according to claim 13, wherein a doping amount of the first fluorescent guest material in the first light-emitting layer and a doping amount of the second fluorescent guest material in the auxiliary light-emitting layer are both higher than 0.5%, and not higher than 5%.

15. The organic light-emitting device according to claim 13, wherein in a case that the first fluorescent guest material and the second fluorescent guest material are different, the auxiliary light-emitting layer further satisfies:

$S1(F)>S1(C)$ and a wavelength band covered by an emission spectrum of the second fluorescent guest material is smaller than a wavelength band covered by an emission spectrum of the first fluorescent guest material, and under normalized conditions, an overlapping area of the absorption spectrum of the first fluorescent guest material and the emission spectrum of the second fluorescent guest material is not less than 50% of an area of the emission spectrum of the second fluorescent guest material.

16. A method for preparing an organic light-emitting device, comprising:

forming an anode layer;

forming a first light-emitting layer on the anode layer, wherein the first light-emitting layer comprises a first host material, a first thermally activated delayed fluorescent material and a first fluorescent guest material;

forming an auxiliary light-emitting layer on a side of the first light-emitting layer away from the anode layer, wherein the auxiliary light-emitting layer comprises a second host material and a second thermally activated delayed fluorescent material, or the auxiliary light-emitting layer comprises a second host material, a second thermally activated delayed fluorescent material and a second fluorescent guest material; and forming a cathode layer on a side of the auxiliary light-emitting layer away from the first light-emitting layer, wherein the number of the auxiliary light-emitting layer is one or plural, the first host material has a lowest singlet energy of S1(A) and a lowest triplet energy of T1(A); the first thermally activated delayed fluorescence material has a lowest singlet energy of S1(B) and a lowest triplet energy of T1(B); the first fluorescent guest material has a lowest singlet energy of S1(C) and a lowest triplet energy of T1(C); the first host material has a HOMO energy level of HOMO(A) and a LUMO energy level of LUMO(A); the first thermally activated delayed fluorescence material has a HOMO energy level of HOMO(B) and a LUMO energy level of LUMO(B); the first light-emitting layer satisfies following conditions:

$S1(A)\text{-}T1(A) > 0.2$ eV $S1(B)\text{-}T1(B) < 0.2$ eV $S1(C)\text{-}T1(C) > 0.2$ eV $S1(A) > S1(B) > S1(C)$ $T1(A) > T1(B)$ $|\text{HOMO}(A)\text{-}\text{HOMO}(B)| < 0.2$ eV $|\text{LUMO}(B)|\text{-}|\text{LUMO}(A)| > 0.3$ eV $|\text{HOMO}(A)|\text{-}|\text{LUMO}(B)| > S1(B)$ and under normalized conditions, an overlapping area of an absorption spectrum of the first fluorescent guest material and an emission spectrum of the first thermally activated delayed fluorescent material is not less than 50% of an area of an emission spectrum of the second thermally activated delayed fluorescent material.

17. A display panel comprising an organic light-emitting device, wherein the organic light-emitting device comprises:

an anode layer;

a cathode layer, arranged opposite to the anode layer;

a first light-emitting layer, arranged between the anode layer and the cathode layer, comprising a first host material, a first thermally activated delayed fluorescent material and a first fluorescent guest material; and an auxiliary light-emitting layer, arranged between the first light-emitting layer and the cathode layer; the auxiliary light-emitting layer at least comprising a second host material and a second thermally activated delayed fluorescent material, wherein the number of the auxiliary light-emitting layer is one or plural, wherein the first host material has a lowest singlet energy of S1(A) and a lowest triplet energy of T1(A); the first thermally activated delayed fluorescence material has a lowest singlet energy of S1(B) and a lowest triplet energy of T1(B); the first fluorescent guest material has a lowest singlet energy of S1(C) and a lowest triplet energy of T1(C); the first host material has a HOMO energy level of HOMO(A) and a LUMO energy level of LUMO(A); the first thermally activated delayed fluorescence material has a HOMO energy level of HOMO(B) and a LUMO energy level of LUMO(B); the first light-emitting layer satisfies following conditions:

$S1(A)\text{-}T1(A) > 0.2$ eV $S1(B)\text{-}T1(B) < 0.2$ eV $S1(C)\text{-}T1(C) > 0.2$ eV $S1(A) > S1(B) > S1(C)$ $T1(A) > T1(B)$ $|\text{HOMO}(A)\text{-}\text{HOMO}(B)| < 0.2$ eV $|\text{LUMO}(B)|\text{-}|\text{LUMO}(A)| > 0.3$ eV $|\text{HOMO}(A)|\text{-}|\text{LUMO}(B)| > S1(B)$ and under normalized conditions, an overlapping area of an absorption spectrum of the first fluorescent guest material and an emission spectrum of the first thermally activated delayed fluorescent material is not less than 50% of an area of an emission spectrum of the second thermally activated delayed fluorescent material.

18. A display device comprising the display panel according to claim 17.

*   *   *   *   *